US010003007B2

(12) United States Patent
Sakai

(10) Patent No.: US 10,003,007 B2
(45) Date of Patent: Jun. 19, 2018

(54) PIEZOELECTRIC ELEMENT, PIEZOELECTRIC ELEMENT APPLICATION DEVICE, AND METHOD FOR MANUFACTURING PIEZOELECTRIC ELEMENT

(71) Applicant: Seiko Epson Corporation, Tokyo (JP)

(72) Inventor: Tomohiro Sakai, Matsumoto (JP)

(73) Assignee: Seiko Epson Corporation (JP)

( * ) Notice: Subject to any disclaimer, the term of this patent is extended or adjusted under 35 U.S.C. 154(b) by 0 days. days.

(21) Appl. No.: 15/227,324

(22) Filed: Aug. 3, 2016

(65) Prior Publication Data

US 2017/0040523 A1    Feb. 9, 2017

(30) Foreign Application Priority Data

Aug. 7, 2015  (JP) ................. 2015-157626

(51) Int. Cl.
  *H01L 41/08*   (2006.01)
  *B41J 2/14*   (2006.01)
  *H01L 41/047*   (2006.01)
  *H01L 41/187*   (2006.01)
  *H01L 41/27*   (2013.01)
  *H01L 41/297*   (2013.01)
  *H01L 41/09*   (2006.01)
  *H01L 41/29*   (2013.01)
  *H01L 41/318*   (2013.01)

(52) U.S. Cl.
  CPC ...... *H01L 41/0805* (2013.01); *B41J 2/14201* (2013.01); *B41J 2/14233* (2013.01); *H01L 41/0477* (2013.01); *H01L 41/0478* (2013.01); *H01L 41/0815* (2013.01); *H01L 41/0973* (2013.01); *H01L 41/1878* (2013.01); *H01L 41/27* (2013.01); *H01L 41/29* (2013.01); *H01L 41/297* (2013.01); *H01L 41/318* (2013.01); *B41J 2002/1425* (2013.01); *B41J 2002/14241* (2013.01); *B41J 2202/03* (2013.01)

(58) Field of Classification Search
CPC .... B41J 2/14201; B41J 2/14233; H01L 41/18
See application file for complete search history.

(56) References Cited

U.S. PATENT DOCUMENTS 6,498,097 B1   12/2002 Park et al.
7,216,962 B2   5/2007 Miyazawa et al.
(Continued)

FOREIGN PATENT DOCUMENTS

CN  104512115 A   4/2015
JP  10-326755 A   12/1998
(Continued)

*Primary Examiner* — J. San Martin
(74) *Attorney, Agent, or Firm* — Harness, Dickey & Pierce, P.L.C.

(57) ABSTRACT

A piezoelectric element includes a first electrode, a piezoelectric layer which is provided on the first electrode and which is formed of crystals of a composite oxide with a perovskite structure which is preferentially oriented in a plane, and a second electrode which is provided on the piezoelectric layer and which is formed of platinum which is preferentially oriented in a plane, in which, in the piezoelectric layer, plane intervals $L_1$ of the crystals on the first electrode side are larger than plane intervals $L_2$ of the crystals on the second electrode side.

4 Claims, 12 Drawing Sheets

(56) References Cited

U.S. PATENT DOCUMENTS

| | | | |
|---|---|---|---|
| 8,597,567 B2* | 12/2013 | Yokoyama | C04B 35/475 |
| | | | 264/638 |
| 8,740,355 B2 | 6/2014 | Nawano et al. | |
| 9,115,031 B2* | 8/2015 | Koizumi | C04B 35/491 |
| 9,318,687 B2* | 4/2016 | Mawatari | H01L 41/0815 |
| 2007/0060467 A1* | 3/2007 | Matsuda | C04B 35/472 |
| | | | 501/134 |
| 2009/0170686 A1* | 7/2009 | Yura | C01G 25/006 |
| | | | 501/135 |
| 2009/0189489 A1* | 7/2009 | Yura | C01G 23/003 |
| | | | 310/358 |
| 2009/0236944 A1* | 9/2009 | Shibata | H01L 41/0805 |
| | | | 310/358 |
| 2010/0071179 A1* | 3/2010 | Koizumi | C01G 23/003 |
| | | | 29/25.35 |
| 2015/0085023 A1* | 3/2015 | Sakai | H01L 41/053 |
| | | | 347/70 |

FOREIGN PATENT DOCUMENTS

| | | |
|---|---|---|
| JP | 2005-039166 A | 2/2005 |
| JP | 2012-018994 A | 1/2012 |
| JP | 2012-139919 A | 7/2012 |
| JP | 2012-204550 A | 10/2012 |
| JP | 2013-099916 A | 5/2013 |

* cited by examiner

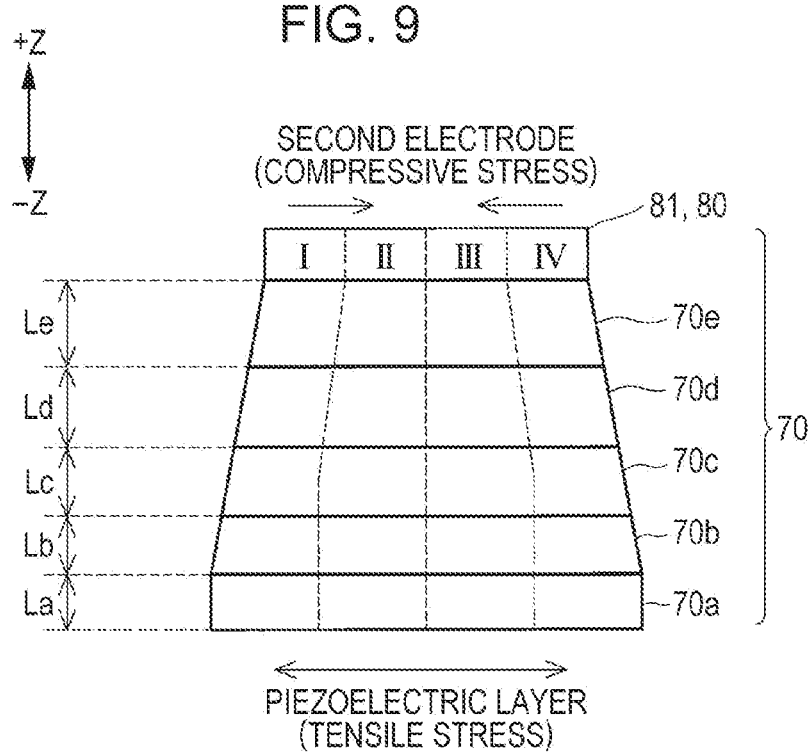
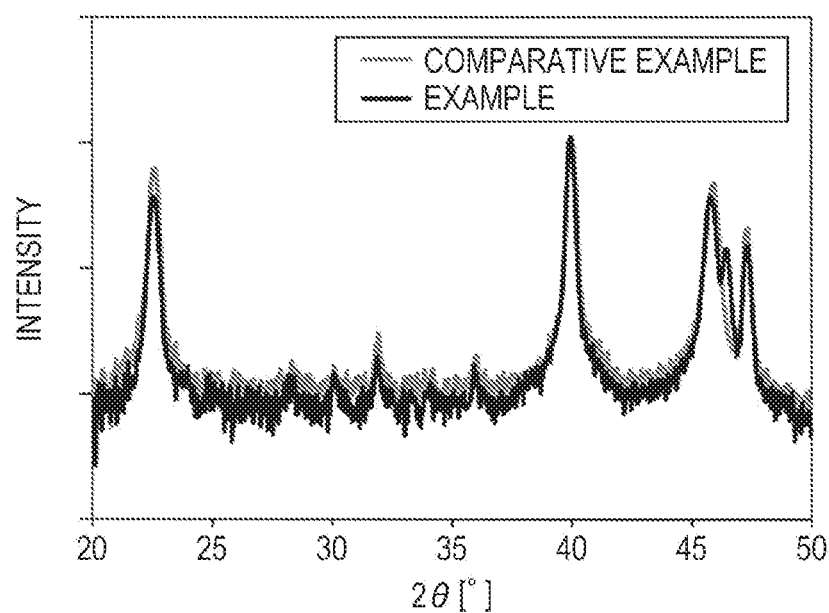

PIEZOELECTRIC ELEMENT, PIEZOELECTRIC ELEMENT APPLICATION DEVICE, AND METHOD FOR MANUFACTURING PIEZOELECTRIC ELEMENT

BACKGROUND

1. Technical Field

The present invention relates to a piezoelectric element which has a first electrode, a piezoelectric layer, and a second electrode which are provided on a substrate, a piezoelectric element application device, and a method for manufacturing a piezoelectric element.

2. Related Art

Liquid ejecting heads are known which eject liquid droplets from nozzle openings which communicate with pressure generating chambers by changing the pressure of a liquid in the pressure generating chambers by deforming piezoelectric elements (piezoelectric actuators). A representative example of a liquid ejecting head is an ink jet recording head which ejects ink droplets as liquid droplets.

An ink jet recording head is, for example, provided with a piezoelectric element on one surface side of a flow path forming substrate in which a pressure generating chamber which communicates with a nozzle opening is provided, and ejects ink droplets from the nozzle opening by changing the pressure of ink in the pressure generating chamber by deforming a vibrating plate by driving the piezoelectric element.

Here, the piezoelectric element is provided with a first electrode, a piezoelectric layer, and a second electrode which are provided on a substrate and the piezoelectric layer is formed by a liquid phase method (for example, refer to JP-A-2013-99916, JP-A-2012-139919, and JP-A-2012-18994).

The piezoelectric layer which is formed by the liquid phase method described above is in a state of being subjected to tensile stress. In recent years, while there is a demand for a piezoelectric element which is able to obtain a large displacement with a low driving voltage, that is, with high displacement efficiency, when the piezoelectric element is in a state of being subjected to tensile stress which is the default state, the characteristics of the piezoelectric layer deteriorate, the displacement amount of the piezoelectric element is small, and the displacement efficiency is low.

These problems are also present in piezoelectric elements which are used for other devices in the same manner without being limited to piezoelectric elements used for liquid ejecting heads such as an ink jet recording head.

SUMMARY

An advantage of some aspects of the invention is to provide a piezoelectric element in which the characteristics of a piezoelectric layer are improved and which has high displacement efficiency, a piezoelectric element application device, and a method for manufacturing a piezoelectric element.

According to an aspect of the invention, there is provided a piezoelectric element including a first electrode, a piezoelectric layer which is provided on the first electrode and which is formed of crystals of a composite oxide with a perovskite structure which is preferentially oriented in a (100) plane, and a second electrode which is provided on the piezoelectric layer and which is formed of platinum which is preferentially oriented in a (100) plane, in which, in the piezoelectric layer, plane intervals of the crystals on the second electrode side are larger than plane intervals of the crystals on the first electrode side.

According to this aspect, since a second electrode formed of platinum which is film-formed on a piezoelectric layer is film-formed on a perovskite (100) plane by lattice matching, after the film-forming, compressive stress is applied to the piezoelectric layer in an in-plane direction, the tensile stress in the in-plane direction, which the piezoelectric layer had before film-forming the second electrode, is reduced, the characteristics of the piezoelectric layer are improved, and a piezoelectric element with high displacement efficiency is obtained.

Here, in the present specification, "plane intervals of crystals" are not intervals of the plane of a crystal lattice in the "in-plane direction" (an X direction or a Y direction which will be described below) which is parallel to the surface of an electrode or a film of a piezoelectric layer or the like, but are intervals of the plane of a crystal lattice in a direction (a Z direction which will be described below) which is orthogonal to the surface of an electrode or a film of a piezoelectric layer or the like.

Here, in the piezoelectric layer, an A-site preferably includes bismuth and a B-site preferably includes iron and titanium. Due to this, it is possible to realize a piezoelectric element which is preferable from the point of view of environmental protection.

According to another aspect of the invention, there is provided a piezoelectric element application device which is provided with the piezoelectric element of the aspect described above. According to this aspect, providing a piezoelectric element with improved characteristics makes it possible to realize a piezoelectric element application device with excellent characteristics.

According to still another aspect of the invention, there is provided a method for manufacturing a piezoelectric element in which the piezoelectric element is formed of a first electrode, a piezoelectric layer, and a second electrode formed in layers on a substrate, the method including forming the piezoelectric layer as a layer which is formed of crystals of a composite oxide with a perovskite structure which is preferentially oriented in a (100) plane by a liquid phase method; and forming the second electrode as a layer which is formed of platinum which is preferentially oriented in a (100) plane by a sputtering method in which a substrate temperature is set to 400° C. to 800° C.

According to this aspect, since a second electrode formed of platinum which is film-formed on a piezoelectric layer is film-formed on a perovskite (100) plane by lattice matching, after the film-forming, compressive stress is applied to the piezoelectric layer, the tensile stress, which the piezoelectric layer had before film-forming the second electrode, is reduced, the characteristics of the piezoelectric layer are improved, and a piezoelectric element with high displacement efficiency is manufactured.

BRIEF DESCRIPTION OF THE DRAWINGS

The invention will be described with reference to the accompanying drawings, wherein like numbers reference like elements.

FIG. 9 is a schematic diagram which shows an effect of the embodiment.

FIG. 10 is a diagram which shows an X-ray diffraction pattern of an Example and a Comparative Example.

DESCRIPTION OF EXEMPLARY EMBODIMENTS

Figure 1:
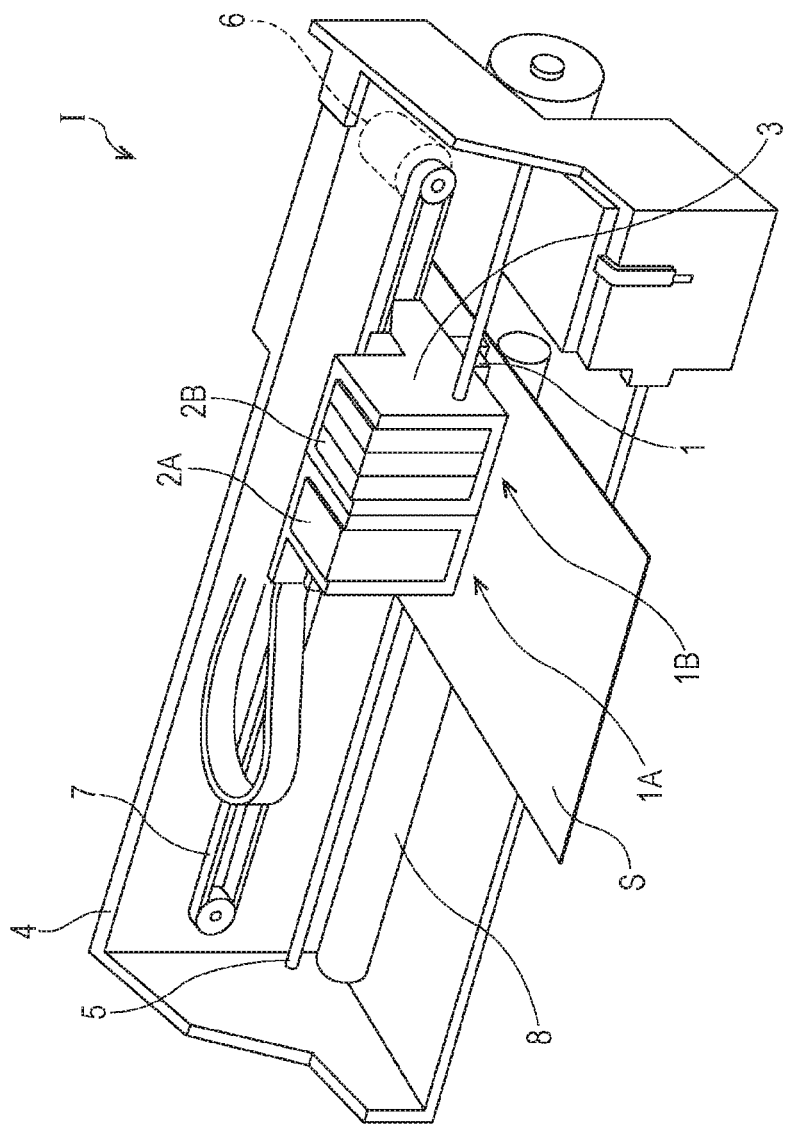
FIG. 1 is a diagram which shows a schematic configuration of a recording apparatus according to an embodiment of the invention.

Description will be given below of embodiments of the invention with reference to diagrams. Here, the description below shows an aspect of the invention and it is possible to make optional changes thereto within the range of the invention. Members which are given the same reference numerals in each diagram indicate the same members and description thereof is appropriately omitted. In addition, in FIG. 2 to FIG. 4B, X, Y, and Z represent three spatial axes which are orthogonal to each other. In the present specification, description will be given by setting directions along these axes as the X direction, the Y direction, and the Z direction respectively. The Z direction represents the thickness direction or the lamination direction of the board, the layer, and the film. The X direction and the Y direction represent in-plane directions of the board, the layer, and the film.

Embodiment 1

FIG. 1 is an ink jet recording apparatus which is an example of a liquid ejecting apparatus according to the embodiment of the invention. As shown in the diagram, in an ink jet recording apparatus I, a cartridges 2A and 2B, which form an ink supply means in an ink jet recording head unit (a head unit) II (refer to FIG. 2) which has a plurality of ink jet recording heads, are provided so as to be able to be attached and detached. A carriage 3 on which the head unit II is mounted is provided on a carriage shaft 5 which is attached to an apparatus main body 4 so as to be able to freely move in the axial direction and, for example, discharges each of a black ink composition and a color ink composition.

The carriage 3 on which the head unit II is mounted is moved along the carriage shaft 5 by the driving force of a driving motor 6 being transmitted to the carriage 3 via a plurality of gears, which are not shown in the diagram, and a timing belt 7. On the other hand, a transport roller 8 is provided in the apparatus main body 4 as a transport means and a recording sheet S which is a recording medium such as paper is transported by the transport roller 8. The transport means which transports the recording sheet S is not limited to a transport roller and may be a belt, a drum, or the like.

Here, the ink jet recording apparatus I described above is a type of recording apparatus where the head unit II is mounted on the carriage 3 and which moves in a main scanning direction; however, the configuration thereof is not particularly limited. The ink jet recording apparatus I may be, for example, a so-called line type recording apparatus which performs printing by fixing the head unit II and moving the recording sheet S such as paper in a sub scanning direction.

According to the ink jet recording apparatus I, it is possible to improve the ejection characteristics since improvement of the displacement characteristics of the piezoelectric element is expected by using the piezoelectric element which is described in detail below.

Figure 2:
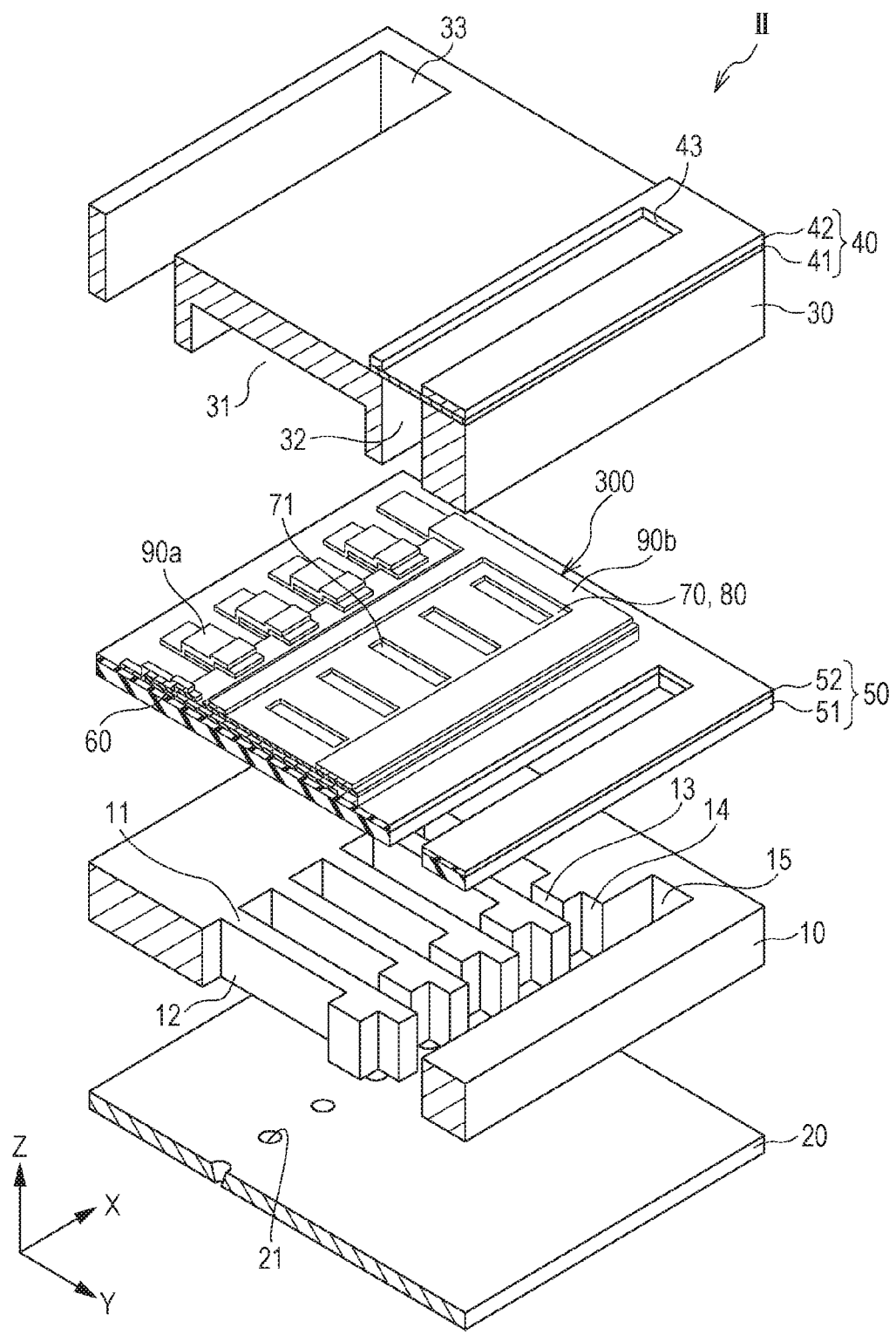
FIG. 2 is an exploded perspective diagram which shows a schematic configuration of a recording head.
Figure 3:
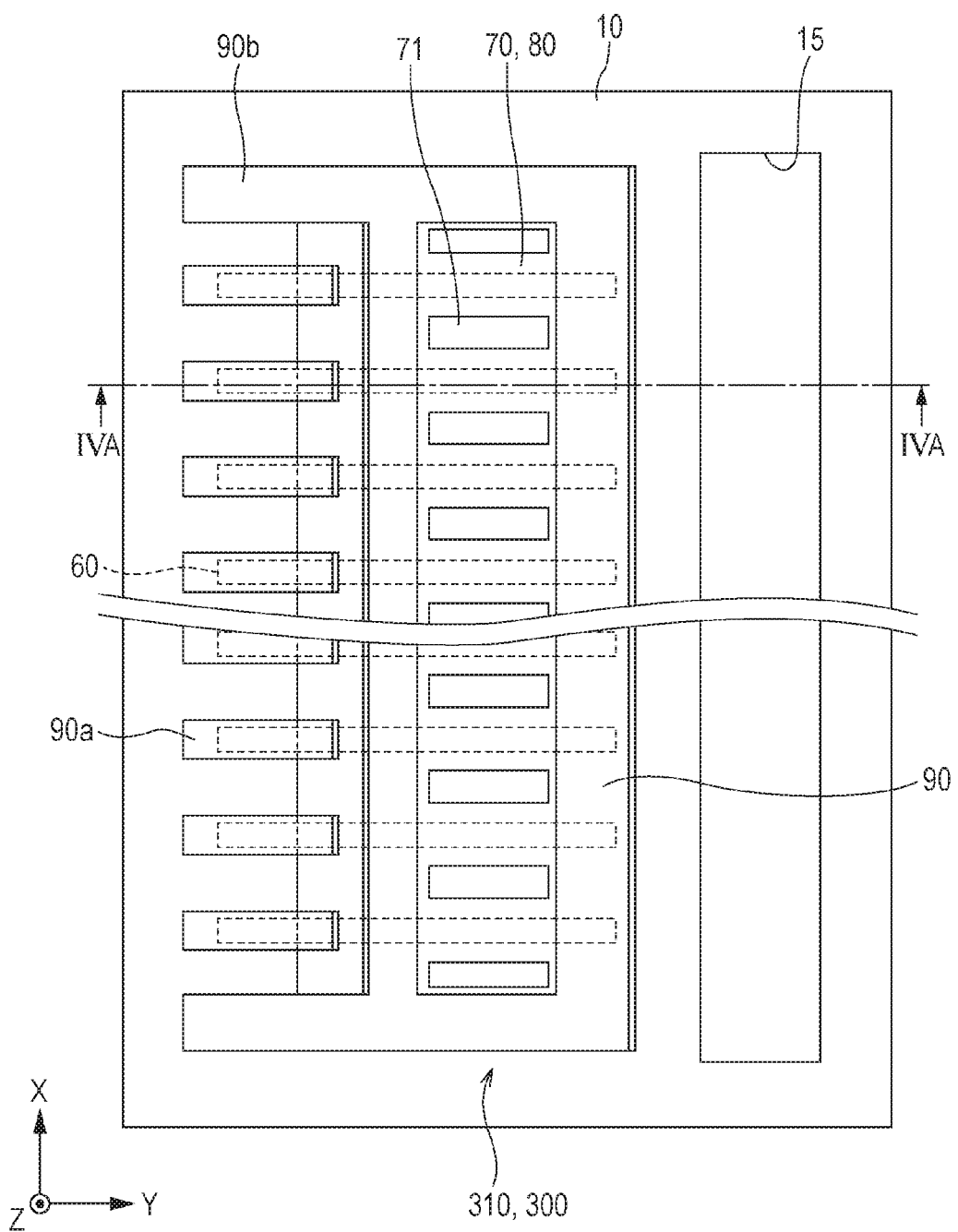
FIG. 3 is a planar diagram of a recording head.
Figure 4A:
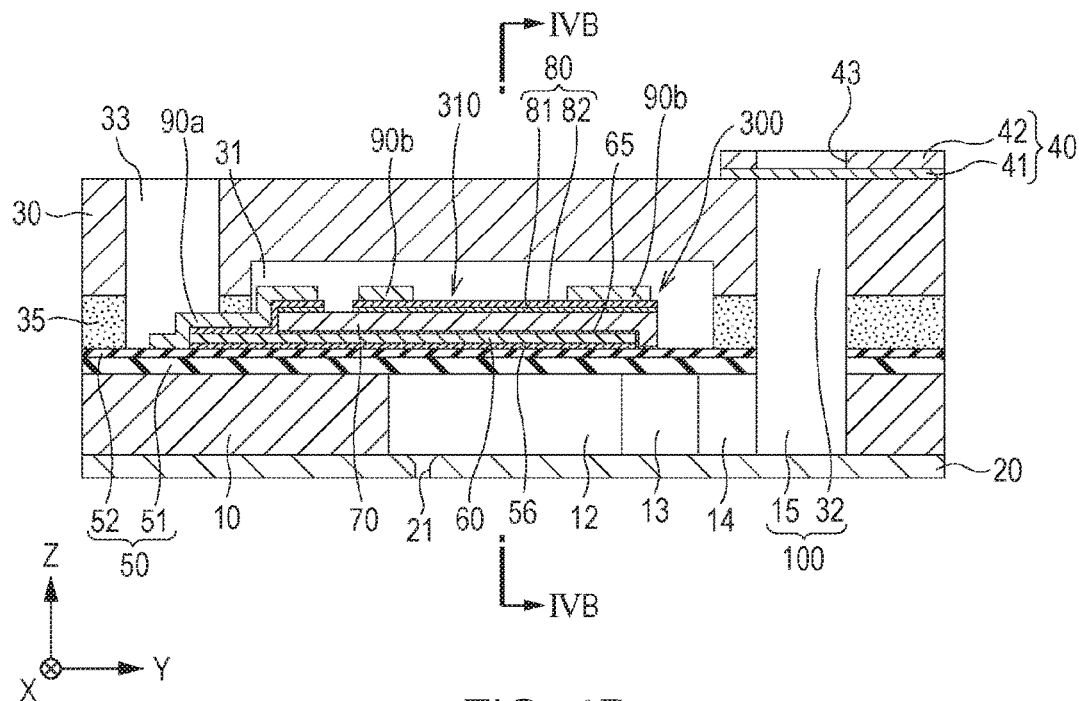
FIGS. 4A and 4B are a cross-sectional diagram and a main portion-enlarged cross-sectional diagram of a recording head.
Figure 4B:
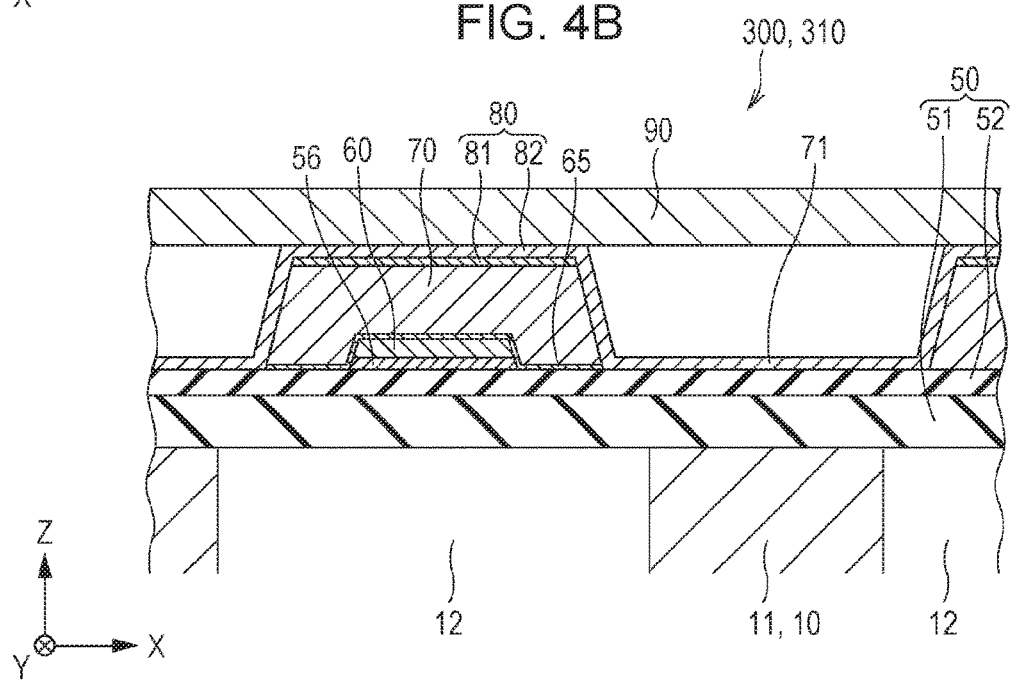

Description will be given of an example of the head unit II which is mounted on the ink jet recording apparatus I described above using FIG. 2 to FIG. 4B. FIG. 2 is an exploded perspective diagram of the ink jet recording head which is an example of the liquid ejecting head according to the embodiment of the invention and FIG. 3 is a planar diagram of FIG. 2. In addition, FIG. 4A is a cross-sectional diagram based on the IVA-IVA line in FIG. 3 and FIG. 4B is a main portion-enlarged cross-sectional diagram based on the IVB-IVB line in FIG. 4A.

A flow path forming substrate 10 (referred to below as a "substrate 10") is, for example, formed of a silicon single crystal substrate and pressure generating chambers 12 are formed therein. The pressure generating chambers 12 which are partitioned by a plurality of partition walls 11 are lined up with a plurality of nozzle openings 21 which discharge ink of the same color along the X direction. The material of the substrate 10 is not limited to silicon and may be SOI, glass, or the like.

In the substrate 10, ink supply paths 13 and communication paths 14 are formed on one end side of the pressure generating chambers 12 in the Y direction. The ink supply paths 13 are formed such that the opening area thereof is small by narrowing one side of the pressure generating chambers 12 from the X direction. In addition, the communication paths 14 have substantially the same width as the pressure generating chambers 12 in the X direction. A communication portion 15 is formed on the outside (+Y direction side) of the communication path 14. The communication portion 15 forms a part of a manifold 100. The manifold 100 is a common ink chamber for each of the pressure generating chambers 12. In this manner, a liquid flow path which is formed of the pressure generating chambers 12, the ink supply paths 13, the communication paths 14, and the communication portion 15 is formed on the substrate 10.

For example, a nozzle plate 20 made of SUS is bonded onto one surface (the surface on the −Z direction side) of the substrate 10. The nozzle openings 21 are lined up along the X direction on the nozzle plate 20. The nozzle openings 21 communicate with each of the pressure generating chambers 12. It is possible to bond the nozzle plate 20 to the substrate 10 by an adhesive agent, a heat welding film, or the like.

A vibrating plate 50 is formed on the other surface (the surface on the +Z direction side) of the substrate 10. The vibrating plate 50 is, for example, formed by an elastic film 51 which is formed on the substrate 10 and an insulating film 52 which is formed on the elastic film 51. The elastic film 51 is, for example, formed of silicon dioxide ($SiO_2$) and the insulating film 52 is, for example, formed of zirconium oxide ($ZrO_2$). The elastic film 51 need not be a member separate to the substrate 10. A part of the substrate 10 may be processed to be thin and used as the elastic film.

A piezoelectric element 300 which includes a first electrode 60, a piezoelectric layer 70, and a second electrode 80 is formed on the insulating film 52 via an adhesive layer 56. The adhesive layer 56 is for improving the adhesiveness between the first electrode 60 and a base and it is possible to use, for example, titanium oxide (TiO$_x$), titanium (Ti), silicon nitride (SiN), or the like as the adhesive layer 56. Here, it is possible to omit the adhesive layer 56.

In the present embodiment, the vibrating plate 50 and the first electrode 60 are displaced by the displacement of the piezoelectric layer 70 which has electro-mechanical conversion characteristics. That is, in the present embodiment, the vibrating plate 50 and the first electrode 60 substantially have a function as a vibrating plate. By omitting the elastic film 51 and the insulating film 52, only the first electrode 60 may function as a vibrating plate. In a case of directly providing the first electrode 60 on the substrate 10, the first electrode 60 is preferably protected by an insulating protective film or the like such that ink does not come into contact with the first electrode 60.

The first electrode 60 is cut and divided for each of the pressure generating chambers 12. In other words, the first electrode 60 is formed as independent electrodes which are independent for each of the pressure generating chambers 12. The first electrode 60 is formed with a narrower width than the width of the pressure generating chamber 12 in the X direction. In addition, the first electrode 60 is formed with a wider width than the pressure generating chamber 12 in the Y direction.

The piezoelectric layer 70 and the second electrode 80 are continuously provided on the first electrode 60 and the vibrating plate 50 in the X direction. The sizes of the piezoelectric layer 70 and the second electrode 80 in the Y direction are larger than the size of the pressure generating chambers 12 in the Y direction.

In addition, recesses 71 which correspond to each of the partition walls 11 are formed in the piezoelectric layer 70. The size of the recesses 71 in the X direction is substantially the same as or larger than the size of each of the partition walls 11 in the X direction.

The second electrode 80 is formed as a common electrode which is common to the plurality of the piezoelectric layers 70. The first electrode 60 may be the common electrode instead of the second electrode 80. In the present embodiment, the second electrode 80 is provided with a first layer 81 which is provided on the piezoelectric layer 70 side and a second layer 82 which is provided on the opposite side to the piezoelectric layer 70 of the first layer 81. The second layer 82 may be omitted.

The end (the end on the +Y direction side) on the ink supply path 13 side of the first electrode 60 is covered by the piezoelectric layer 70 and the second electrode 80. On the other hand, the end (the end on the −Y direction side) on the nozzle opening 21 side of the first electrode 60 is exposed from the end on the −Y direction side of the piezoelectric layer 70. The end on the −Y direction side of the first electrode 60 is connected to lead electrodes 90a via material layers (the first layers 81 and 82 which will be described below) which are formed in the same step as the step of forming the second electrode 80.

In addition, a lead electrode 90b is connected to the second electrode 80. It is possible to simultaneously form the lead electrodes 90a and 90b by forming a layer of materials which form the lead electrodes 90a and 90b over the entire surface on the substrate 10 on which the vibrating plate 50 to the second electrode 80 are formed, and then patterning the layer into a predetermined shape.

In the present embodiment, a liquid ejecting head is exemplified in which the first electrode 60 forms independent electrodes which are independently provided corresponding to the pressure generating chambers 12 and the second electrode 80 forms a common electrode which is continuously provided over the lining up direction of the pressure generating chambers 12; however, the first electrode 60 may form a common electrode which is continuously provided over the lining up direction of the pressure generating chambers 12 and the second electrode 80 may form independent electrodes which are independently provided corresponding to the pressure generating chambers 12.

A protective substrate 30 is bonded onto the substrate 10 on which the piezoelectric element 300 is formed by an adhesive agent 35. The protective substrate 30 has a manifold portion 32. At least a part of the manifold 100 is formed by the manifold portion 32. The manifold portion 32 according to the present embodiment passes through the protective substrate 30 in the thickness direction (the Z direction) and, moreover, is formed over the width direction (the X direction) of the pressure generating chambers 12. The manifold portion 32 communicates with the communication portion 15 of the substrate 10 as described above. The above configuration forms the manifold 100 which is a common ink chamber for each of the pressure generating chambers 12.

A compliance substrate 40 which is formed of a sealing film 41 and a fixing board 42 is bonded onto the protective substrate 30. A region which is opposed to the manifold 100 of the fixing board 42 forms an opening 43 which is completely removed in the thickness direction (the Z direction). One surface (a surface on the +Z direction side) of the manifold 100 is sealed only with the sealing film 41 which has flexibility.

In the ink jet recording head, after taking in ink from an ink inlet which is connected to an external ink supply means which is not shown in the diagram and filling the interior with ink from the manifold 100 to the nozzle openings 21, the pressure in each of the pressure generating chambers 12 is increased and ink droplets are discharged from the nozzle openings 21 by applying voltage between the first electrodes 60 and the second electrode 80 which correspond respectively to the pressure generating chambers 12 and flexibly deforming the vibrating plate 50, the adhesive layer 56, the first electrode 60, a seed layer 65, and the piezoelectric layer 70 according to a recording signal from a driving circuit which is not shown in the diagram.

Next, more detailed description will be given of the piezoelectric element 300. The piezoelectric element 300 includes the first electrodes 60, the second electrode 80, and the piezoelectric layer 70 which is provided between the first electrodes 60 and the second electrode 80. The thickness of the first electrode 60 is approximately 50 nm. The piezoelectric layer 70 is a so-called piezoelectric substance which is a thin film with a thickness of 50 nm or more to 2000 nm or less. The thickness of the second electrode 80 is approximately 50 nm. Any of the thicknesses of each of the elements which are exemplified here is an example and it is possible to make changes thereto within a range which does not change the gist of the invention.

It is necessary for the material of the first electrode 60 to be a material which is able to maintain conductivity without being oxygenated when forming the seed layer 65 and the piezoelectric layer 70. Examples thereof include noble metals such as platinum (Pt) and iridium (Ir) or a conductive oxide which is represented by lanthanum nickel oxide (LNO) or the like. Among these, platinum is preferably used from the point of view of the ease of orientation of the piezoelectric layer 70. In the present embodiment, platinum which is preferentially oriented in the (111) plane and of which the half value width of a diffraction peak according to an X-ray diffraction method which is derived from the (111) plane is 10 degrees or less is used as the first electrode 60. Here, "preferentially oriented" refers to all of the crystals or most of the crystals (for example, 50% or more, preferably 80% or more) being oriented in a specific direction, for example, in the (111) plane or the (100) plane.

The seed layer 65 is formed of a composite oxide which has a perovskite structure and of which the A-site includes bismuth (Bi) and the B-site includes iron (Fe) and titanium (Ti) and which is self-oriented in the (100) plane. 12 oxygen atoms are oriented in the A-site with a perovskite structure, that is, an $ABO_3$ type structure, and, in addition, 6 oxygen atoms are oriented in the B-site to form an eight-sided shape (an octahedron). Bi is positioned at the A-site and Fe and Ti are positioned at the B-site. Here, "self-oriented in the (100) plane" refers to being preferentially oriented in the (100) plane itself without being affected by the base. The seed layer 65 which is formed by this configuration functions as an orientation control layer which preferentially orients the piezoelectric layer 70 with a perovskite structure which is formed on the seed layer 65 in the (100) plane.

The piezoelectric layer 70 is a piezoelectric material which is formed of a composite oxide which has a perovskite structure, that is, an $ABO_3$ type structure. Examples of piezoelectric materials include a composite oxide which has a lead-free perovskite structure which does not include lead. Examples of lead-free piezoelectric materials include ferrate bismuth (($BiFeO_3$), abbreviation "BFO"), barium titanate (($BaTiO_3$), abbreviation "BT"), sodium potassium niobate (($K,Na)(NbO_3)$, abbreviation "KNN"), potassium sodium lithium niobate (($K,Na,Li)(NbO_3)$), sodium potassium lithium niobate tantalate (($K,Na,Li)(Nb,Ta)O_3$), bismuth potassium titanate (($Bi_{1/2}K_{1/2})TiO_3$, abbreviation "BKT"), bismuth sodium titanate (($Bi_{1/2}Na_{1/2})TiO_3$, abbreviation "BNT"), bismuth manganate ($BiMnO_3$, abbreviation "BM"), and the like. In addition, examples thereof include a composite oxide (($Bi,K)(Ti,Fe)O_3$) which includes bismuth, potassium, titanium, and iron, a composite oxide (($Bi,Ba)(Fe,Ti)O_3$) which includes bismuth, iron, barium, and titanium, a composite oxide (($Bi,Ba)(Fe,Ti,M)O_3$) (M is Mn, Co, or Cr) to which metal such as manganese, cobalt, and chromium is added, and the like.

In addition, the piezoelectric material is not limited to a lead-free piezoelectric material which does not include lead and it is also possible to use a lead-based piezoelectric material which includes lead, for example, lead zirconate titanate (PZT) or a material to which a metal oxide such as niobium oxide, nickel oxide, or magnesium oxide is added. In detail, examples thereof include lead titanate ($PbTiO_3$), lead zirconate titanate ($Pb(Zr,Ti)O_3$), lead zirconate ($PbZrO_3$), lead lanthanum titanate (($Pb,La), TiO_3$), lead lanthanum zirconate titanate (($Pb,La)(Zr,Ti)O_3$), magnesium niobate zirconium titanate ($Pb(Zr,Ti)(Mg,Nb)O_3$), and the like.

The piezoelectric layer 70 which is formed of the piezoelectric material takes on the crystal orientation of the seed layer 65 and is preferentially oriented in the (100) plane by being formed on the seed layer 65. In detail, as shown in Examples which will be described below, it is confirmed that the piezoelectric layer 70 is preferentially oriented in the (100) plane with a high orientation ratio of at least 89% or more. In the invention, when comparing a peak intensity which is derived from the (100) plane of the diffraction peak by an X-ray diffraction method (XRD) with a peak intensity which is derived from the (110) plane, a value of (100)/[(100)+(110)] is set as the orientation ratio. The orientation ratio is preferably 80% or more and even more preferably 90% or more from the point of view that the displacement characteristics and durability of the piezoelectric layer 70 are improved. Here, the piezoelectric layer 70 is preferably a rhombohedron from the point of view that the displacement characteristics are excellent.

In addition, tensile stress is generated in the in-plane direction in the piezoelectric layer 70. The tensile stress is easily generated, particularly in a case where the piezoelectric layer 70 is formed by a liquid phase method.

The second electrode 80 is provided on the opposite surface side to the first electrode 60 of the piezoelectric layer 70 and is formed as a common electrode. In the present embodiment, the second electrode 80 is provided with a first layer 81 which is provided on the piezoelectric layer 70 side, and a second layer 82 which is provided on the opposite side to the piezoelectric layer 70 of the first layer 81. Here, the second layer 82 may be omitted.

In the present embodiment, the first layer 81 is formed of platinum which is preferentially oriented in the (100) plane. Although detailed description will be given below, in particular, the first layer 81 of the second electrode 80 has compressive stress relative to the piezoelectric layer 70 and acts so as to reduce the tensile stress on the piezoelectric layer 70. The first layer 81 is formed by a high temperature sputtering method in which a substrate temperature is held at a high temperature, for example, 400° C. to 800° C., preferably 500° C. to 700° C. Due to this, the first layer 81 is film-formed so as to be lattice-matched in the (100) orientation plane of the piezoelectric layer 70 and is preferentially oriented in the (100) plane. The first layer 81 is formed only on the piezoelectric layer 70, that is, only on a surface on the opposite side to the substrate 10 of the piezoelectric layer 70.

In addition, the second layer 82 which forms the second electrode 80 is preferably formed of platinum which is (100) oriented in the same manner as the first layer 81; however, it is also possible to use, for example, metal materials such as iridium (Ir), palladium (Pd), or gold (Au). Naturally, the second layer 82 may be a single material of the metal materials described above or may be a plurality of materials in which a plurality of materials is mixed. In the present embodiment, the second layer 82 is continuously provided on the first layer 81, on the side surface of the piezoelectric layer 70 where the first layer 81 is not provided, and on the first electrode 60.

Next, with reference to FIG. 5A to FIG. 8C, description will be given of an example of a method for manufacturing the piezoelectric element 300 of the present embodiment along with a method for manufacturing the ink jet recording head. Here, FIG. 5A to FIG. 8C are cross-sectional diagrams in the longitudinal direction (the second direction) of the pressure generating chambers.

Figure 5A:
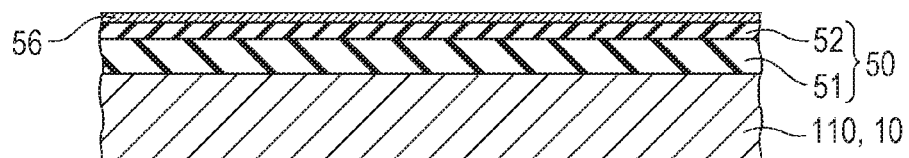
FIGS. 5A to 5D are cross-sectional diagrams which show steps of manufacturing a recording head.

Firstly, as shown in FIG. 5A, a silicon substrate 110 is prepared. Next, the elastic film 51 which is formed of silicon dioxide ($SiO_2$) or the like is formed on the surface of the silicon substrate 110 by thermally oxidizing the silicon substrate 110. Furthermore, the insulating film 52 which is formed of a zirconium oxide film is obtained by forming a zirconium film on the elastic film 51 by a sputtering method and thermally oxidizing the result. In this manner, the vibrating plate 50 which is formed of the elastic film 51 and the insulating film 52 is formed. Furthermore, a titanium oxide film which forms the adhesive layer 56 is formed by forming a titanium film on the insulating film 52 by a sputtering method and thermally oxidizing the result.

Figure 5B:
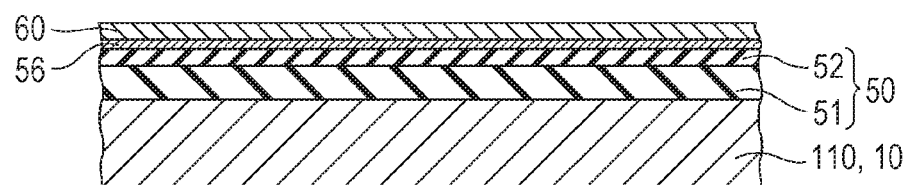
Figure 5C:
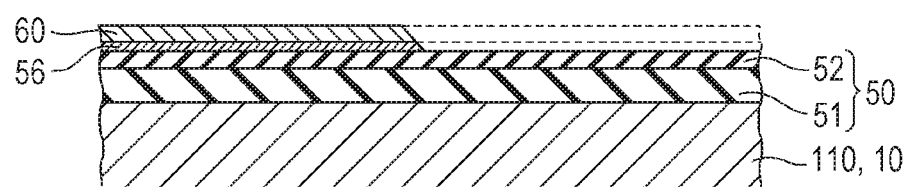

Next, as shown in FIG. 5B, a platinum layer which forms the first electrode 60 is formed by a sputtering method, a vapor deposition method, or the like. After that, as shown in FIG. 5C, the titanium oxide film which forms the adhesive layer 56 and the platinum layer which forms the first electrode 60 are simultaneously patterned to form a desired shape. For the patterning of the adhesive layer 56 and the first electrode 60, it is possible to use, for example, a so-called photolithographic method in which a mask (which is not shown in the diagram) is formed in a predetermined shape on the first electrode 60 and etching is carried out on the adhesive layer 56 and the first electrode 60 via the mask.

Figure 5D:
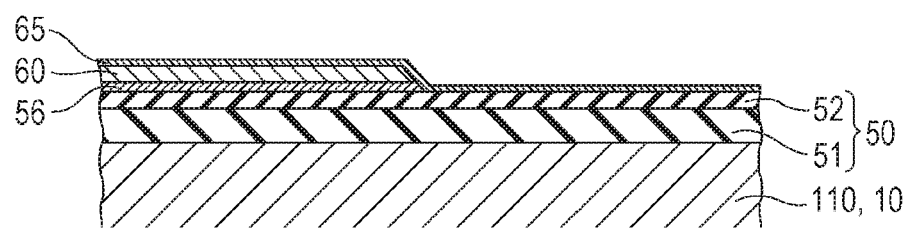

Next, as shown in FIG. 5D, the seed layer 65 is formed on the first electrode 60 (and the insulating film 52). The seed layer 65 is formed of a composite oxide which has a perovskite structure and in which the A-site includes Bi and the B-site includes Fe and Ti and which is self-oriented in the (100) plane. It is possible to form the seed layer 65, for example, by a solution method such as a metal-organic decomposition (MOD) method or a sol-gel method. In addition, it is also possible to form the seed layer 65 by a solid phase method such as a laser ablation method, a sputtering method, a pulse laser deposition method (a PLD method), a chemical vapor deposition (CVD) method, or an aerosol deposition method.

The specific steps in a case of forming the seed layer 65 by a solution method are as below. Firstly, a precursor solution for the seed layer 65 which is formed of an MOD solution or sol which includes a metal complex is prepared. Next, a precursor film is formed by coating the precursor solution on the first electrode 60 by a spin coating method or the like (coating step).

The precursor solution for the seed layer 65 is a precursor solution in which a metal complex which may form a composite oxide which includes Bi, Fe, and Ti by firing is dissolved or dispersed in an organic solvent, and it is possible to use, for example, alkoxides, organic acid salts, β diketone complexes, and the like. The mixture ratio of the metal complex is determined such that each metal has a desired mol ratio. Examples of metal complexes which include Bi include bismuth 2-ethylhexanoate, bismuth acetate, and the like. Examples of metal complexes which include Fe include iron 2-ethylhexanoate, iron acetate, tris (acetyl acetonate) iron, and the like. Examples of metal complexes which include Ti include titanium 2-ethylhexanoate, titanium acetate, and the like. A metal complex which includes two or more types of Bi, Fe, and Ti may be used. In addition, two or more types of metal complexes which include each of the elements may be used. For example, two or more types of metal complexes which include Bi may be used. In addition, examples of the solvent of the precursor solution include propanol, butanol, pentanol, hexanol, octanol, ethylene glycol, propylene glycol, octane, decane, cyclohexane, xylene, toluene, tetrahydrofuran, acetate, octylic acid, and the like.

Subsequently, the precursor film is dried for a certain period by being heated to a predetermined temperature (for example, 150° C. to 200° C.) (drying step). Next, degreasing is carried out by heating the dried precursor film to a predetermined temperature (for example, 350° C. to 450° C.) and maintaining this temperature for a certain period (degreasing step). Here, the degreasing which is referred to is the separating of organic components which are included in the precursor film such as, for example, $NO_2$, $CO_2$, $H_2O$, and the like. The atmosphere in the drying step or the degreasing step is not limited and the steps may be carried out in the atmosphere, in an oxygen atmosphere, or in an inert gas.

Finally, the seed layer 65 is completed by heating the precursor film which is degreased to a higher temperature, for example, approximately 600° C. to 850° C., and maintaining the temperature for a certain period, for example, 1 minute to 10 minutes to cause crystallization (firing step).

Even in the firing step, the atmosphere is not limited and the step may be carried out in the atmosphere, in an oxygen atmosphere, or in an inert gas. Examples of a heating apparatus which is used in the step of drying the seed layer, the step of degreasing the seed layer, and the step of firing the seed layer include a rapid thermal annealing (RTA) apparatus, which heats by irradiation with an infrared ray lamp, a hot plate, and the like.

A seed layer which is formed of a plurality of layers may be formed by repeating the series of steps from the coating step to the firing step described above a plurality of times. Here, in the series of steps from the coating step to the firing step, the firing step may be carried out after repeating the steps from the coating step to the degreasing step a plurality of times.

Figure 6A:
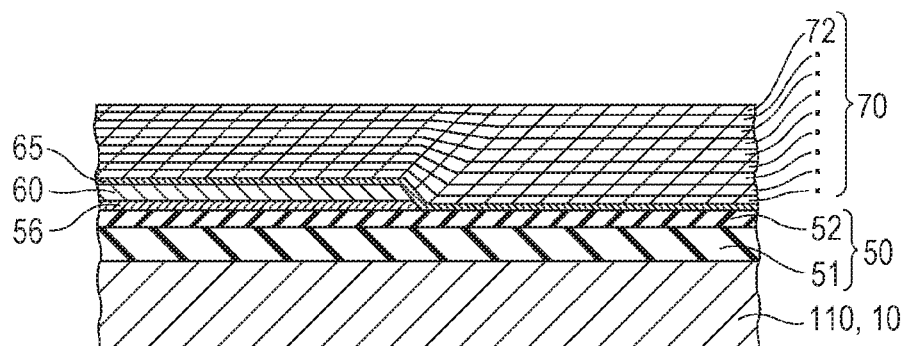
FIGS. 6A and 6B are cross-sectional diagrams which show steps of manufacturing a recording head.

Next, as shown in FIG. 6A, the piezoelectric layer 70 which is formed of a plurality of piezoelectric films 72 is formed on the seed layer 65. It is possible to produce the piezoelectric layer 70 by the same method as the seed layer 65. FIG. 6A shows an example of forming the piezoelectric layer 70 by a liquid phase method. As shown in FIG. 6A, the piezoelectric layer 70 which is formed by a liquid phase method has a plurality of the piezoelectric films 72 which are formed by the series of steps from the coating step to the firing step. That is, the piezoelectric layer 70 is formed by repeating the series of steps from the coating step to the firing step a plurality of times. The series of steps from the coating step to the firing step are the same as in the step of forming the seed layer 65 by a liquid phase method apart from the point of using the precursor solution for the piezoelectric films 72 instead of the precursor solution for the seed layer 65.

As an example, in a case of forming the piezoelectric film 72 which are formed of a composite oxide which has a perovskite structure which includes Bi, Ba, Fe, and Ti, a precursor solution in which a metal complex which may form a composite oxide which includes Bi, Ba, Fe, and Ti by firing is dissolved or dispersed in an organic solvent is used as the precursor solution. In addition, in a case of adding a small amount of metal such as Mn, Co, and Cr to the material which is the base, a metal complex which includes such additive metals is further added to the precursor solution. As the metal complex, it is possible to use, for example, alkoxide, organic acid salts, β diketone complexes, and the like in the same manner as in the case of the seed layer 65. Regarding the metal complex which includes Bi, Fe, and Ti, it is possible to use the same metal complexes as the metal complex which is used when forming the precursor film for the seed layer 65. Examples of metal complexes which include Ba include barium acetate, barium isopropoxide, barium 2-ethylhexanoate, barium acetyl acetonate, and the like. Examples of metal complexes which contain Mn include manganese 2-ethylhexanoate, manganese acetate, and the like. Examples of organic metal compounds which include Co include cobalt 2-ethylhexanoate, cobalt (III) acetyl acetonate, and the like. Examples of organic metal compounds which include Cr include chromium 2-ethylhexanoate and the like. A metal complex which includes two or more types of Bi, Ba, Fe, Ti, and the like may be used. In addition, two or more types of metal complexes which include each of the elements may be used. For example, two or more types of metal complexes which include Bi may be used. In addition, examples of the solvent of the precursor solution include propanol, butanol, pentanol, hexanol, octanol, ethylene glycol, propylene glycol, octane, decane, cyclohexane, xylene, toluene, tetrahydrofuran, acetate, octylic acid, and the like.

FIG. 6A shows an example of forming the piezoelectric layer 70 which is formed of 9 layers of the piezoelectric films 72 by repeating the series of steps from the coating step to the firing step described above 9 times. In a case where the film thickness of the precursor film which is formed by the coating step is approximately 0.1 μm, the total film thickness of the piezoelectric layer 70 which is formed of the piezoelectric films 72 with 9 layers is approximately 0.9 μm.

The piezoelectric layer 70 which is formed in this manner takes on the crystal orientation of the seed layer 65 and is preferentially oriented in the (100) plane.

Figure 6B:
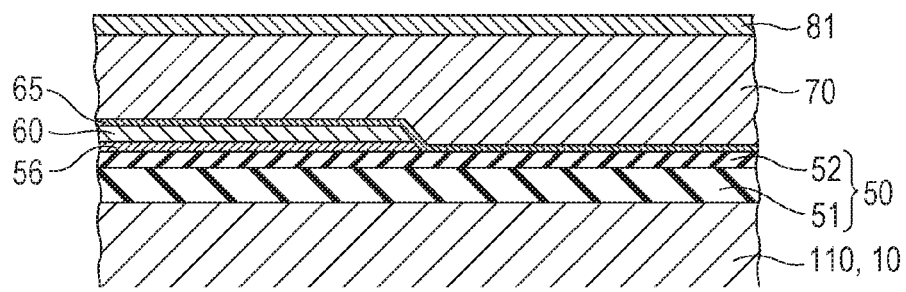

Next, as shown in FIG. 6B, the first layer 81 is formed on the piezoelectric layer 70 as a part of the second electrode 80. The first layer 81 is film-formed by sputtering platinum by setting the substrate temperature to 400° C. to 800° C., preferably 500° C. to 700° C. At this time, the platinum is (100) oriented so as to match the lattice on the (100) orientation plane of the perovskite composite oxide which forms the piezoelectric layer 70. When the substrate temperature decreases after film-forming, all of the materials such as the substrate 10, the piezoelectric layer 70, and the first layer 81 contract. At this time, the linear expansion coefficient of the substrate 10 is smaller than the linear expansion coefficient of the piezoelectric layer 70. Since the substrate 10 hardly contracts while the piezoelectric layer 70 contracts greatly, tensile stress is generated in the piezoelectric layer 70 in the in-plane direction. In addition, the linear expansion coefficient of the first layer 81 is greater than the linear expansion coefficient of the piezoelectric layer 70. The first layer 81 contracts to a greater extent than the piezoelectric layer 70. Since the lattice of the piezoelectric layer 70 and the lattice of the first layer 81 are matched, the piezoelectric layer 70 is shrunk by being pulled by the first layer 81. As the result thereof, the first layer 81 has compressive stress relative to the piezoelectric layer 70 and the piezoelectric layer 70 is in a state where the tensile stress in the in-plane direction is reduced. In contrast, tensile stress is generated in the first layer 81 in the in-plane direction.

FIG. 9 schematically represents this state. FIG. 9 schematically shows a state where the first layer 81 is formed by 4 crystal lattices and the piezoelectric layer 70 is formed by a crystal lattice with 5 layers and 4 rows (20 in total). In FIG. 9, the crystal lattices with 5 layers which form the piezoelectric layer 70 are a, b, c, d, and e from the bottom side. In addition, the crystal lattices with 4 rows which form the crystal lattice layers a to e of the first layer 81 and the piezoelectric layer 70 are I, II, III, and IV from the left. For example, a case of showing the crystal lattice on the leftmost side of the first layer 81 is referred to as the "crystal lattice 81I" and a case of showing the crystal lattice on third layer from the bottom of the piezoelectric layer 70c and the second from the left is referred to as the "crystal lattice 70cII". In addition, in FIG. 9, the plane intervals of the crystals which form the crystal lattice layers 70a to 70e of the piezoelectric layer 70 are La, Lb, Lc, Ld, and Le respectively. In addition, arrows of the tensile stress and the compressive stress shown in FIG. 9 are all relative and are shown with the piezoelectric layer 70 as a reference.

As previously described, tensile stress is generated in the piezoelectric layer 70 in the in-plane direction. In addition, tensile stress is generated in the first layer 81 in the in-plane direction. Due to the tensile stress, the crystal lattices 70aI to 70eIV of the piezoelectric layer 70 and the crystal lattices 81I to 81IV of the first layer are all in a state of being stretched in the in-plane direction.

In addition, the first layer 81 has compressive stress relative to the piezoelectric layer 70 and the tensile stress of the piezoelectric layer 70 in the in-plane direction is in a partially reduced state. When the direction from the substrate 10 to the first layer 81 is the +Z direction, the tensile stress which acts on the piezoelectric layer 70 is greater on the −Z direction side (the substrate 10 side) and becomes smaller toward the +Z direction side (the first layer 81 side). In addition, the compressive stress which acts on the piezoelectric layer 70 is greater on the +Z direction side (the first layer 81 side) and becomes smaller toward the −Z direction side (the substrate 10 side). The crystals which form the piezoelectric layer 70 shrink in the in-plane direction toward the upper layer under the influence of the compressive stress of the first layer 81. Since a force which keeps the volume substantially constant acts on the crystals, the crystal lattices which are shrunk in-plane extend in an orthogonal direction. Thus, the plane intervals La to Le of the crystals which form the piezoelectric layer 70 are smaller on the −Z direction side and larger toward the +Z direction side. That is, La<Lb<Lc<Ld<Le.

Figure 7A:
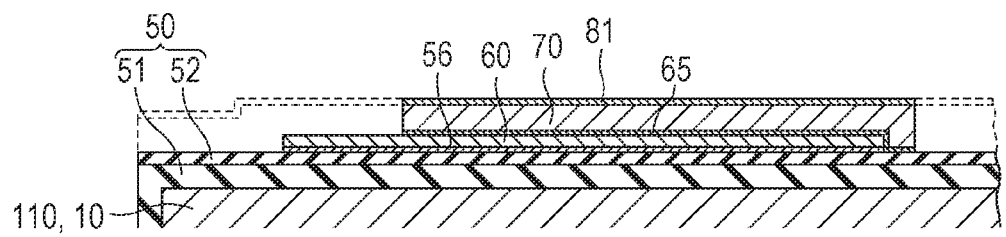
FIGS. 7A to 7C are cross-sectional diagrams which show steps of manufacturing a recording head.

Next, as shown in FIG. 7A, the first layer 81 and the piezoelectric layer 70 are patterned corresponding to each of the pressure generating chambers 12. Regarding the patterning of the first layer 81 and the piezoelectric layer 70, it is possible to use, for example, a so-called photolithographic method in which a mask (which is not shown in the diagram) is formed in a predetermined shape on the first layer 81 and etching is carried out on the first layer 81 and the piezoelectric layer 70 via the mask.

Figure 7B:
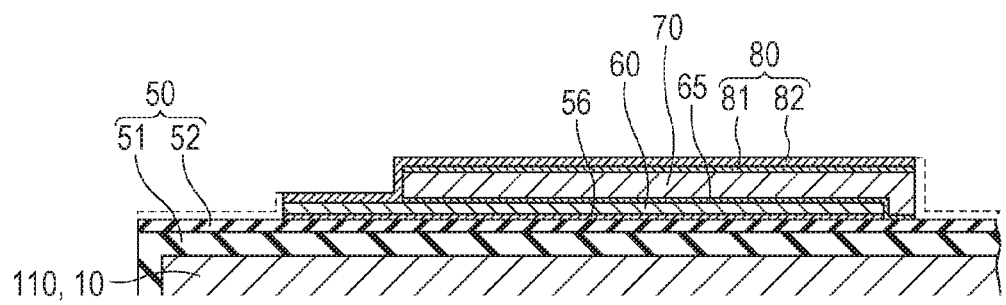

Next, as shown in FIG. 7B, the second layer 82 is formed on one surface side (the surface side on which the piezoelectric layer 70 is formed) of the substrate 110. It is possible to form the second layer 82 by sputtering platinum by setting the substrate temperature to 400° C. to 800° C., preferably 500° C. to 700° C., in the same manner as the first layer 81. At this time, the second layer 82 is film-formed in a state of lattice matching in the (100) orientation plane of the first layer 81 in the same manner as the first layer 81. When the substrate temperature decreases after film-forming, all the materials such as the flow path forming substrate 10, the piezoelectric layer 70, and the first layer 81 contract; however, since the linear expansion coefficient of the first layer 81 and the second layer 82 is greater than that of the piezoelectric layer 70, the first layer 81 and the second layer 82 contract greatly and since the piezoelectric layer 70 and the first layer 81 and the second layer 82 are lattice-matched at this time, the piezoelectric layer 70 further contracts in the in-plane direction by being pulled by not only by the first layer 81 but also by the second layer 82. According to the above steps, the piezoelectric element 300 provided with the first electrode 60, the piezoelectric layer 70, and the second electrode 80 is completed. In the present embodiment, a portion where the first electrode 60, the piezoelectric layer 70, and the second electrode 80 overlap each other substantially functions as the piezoelectric element 300.

Figure 7C:
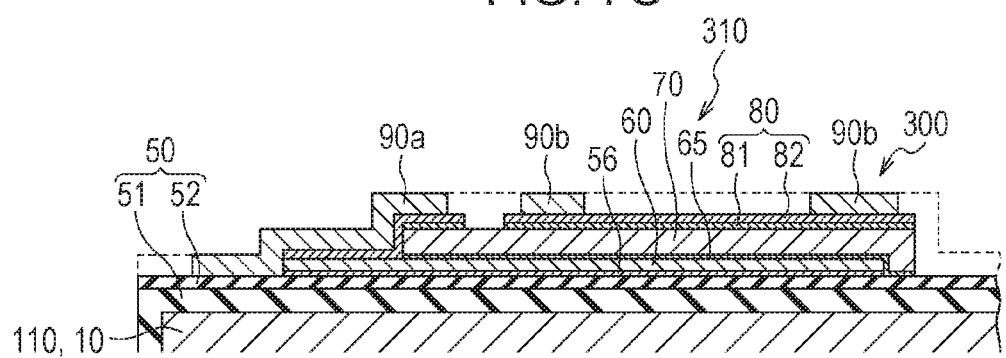

Next, as shown in FIG. 7C, the lead electrodes 90a and 90b which are formed of, for example, gold (Au) and the like are formed on the substrate 110. It is possible to simultaneously form the lead electrodes 90a and 90b on the substrate 110 by forming a layer of materials which form the lead electrodes 90a and 90b over the entire surface, and then patterning the layer into a predetermined shape. It is also possible to use a photolithographic method as described above for the patterning at this time.

Figure 8A:
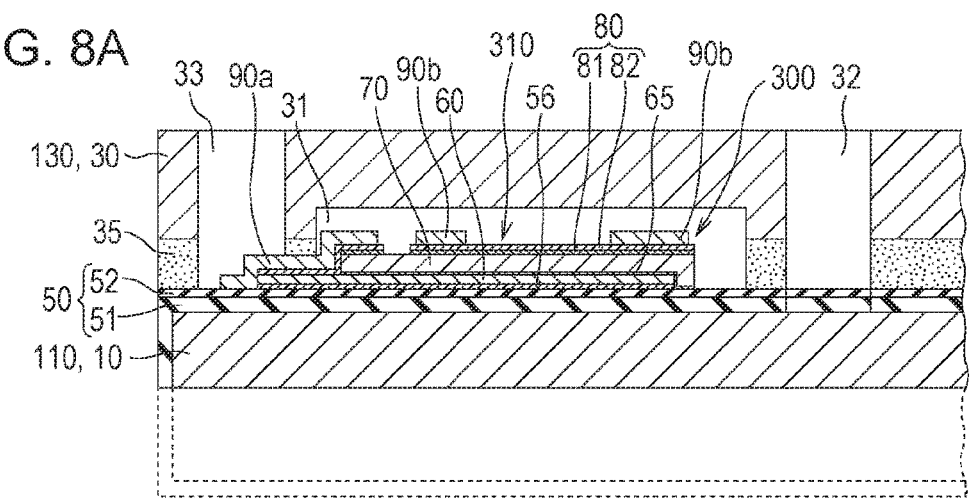
FIGS. 8A to 8C are cross-sectional diagrams which show steps of manufacturing a recording head.

Next, as shown in FIG. 8A, a protective substrate wafer 130 is bonded to the surface on the piezoelectric element 300 side of the substrate 110 by the adhesive agent 35. In addition, the manifold portion 32 or through holes 33 are formed in the protective substrate wafer 130.

Figure 8B:
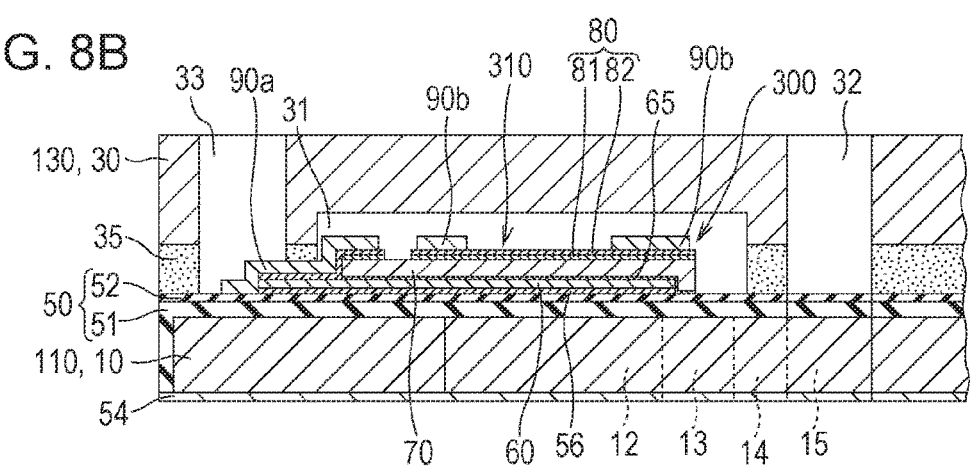
Figure 8C:
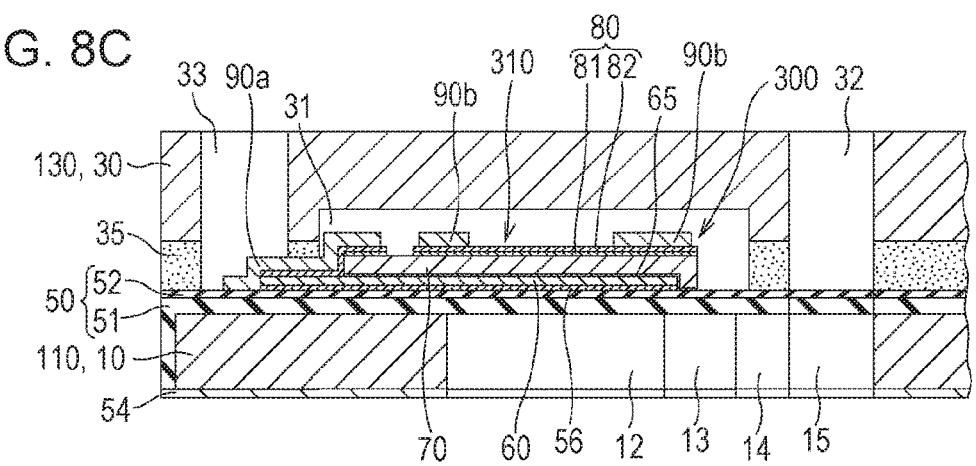

Next, the surface of the substrate 110 is scraped to be thin. As shown in FIG. 8B, a mask film 54 is newly formed on the substrate 110 and patterned into a predetermined shape. As shown in FIG. 8C, anisotropic etching (wet etching) which uses an alkali solution such as KOH is carried out with respect to the substrate 110 via the mask film 54. Due to this, the pressure generating chamber 12, the ink supply path 13, the communication path 14, and the communication portion 15 are formed.

Next, unnecessary portions of the periphery of the silicon substrate 110 and the protective substrate wafer 130 are cut and removed by dicing or the like. Furthermore, the nozzle plate 20 is bonded to the surface on the opposite side to the piezoelectric element 300 of the silicon substrate 110 (refer to FIG. 4A). In addition, the compliance substrate 40 is bonded to the protective substrate wafer 130 (refer to FIG. 4A). Through the steps up to this point, the collection of chips of the head unit II is completed. The head unit II is obtained by dividing the collection into individual chips.

More detailed description will be given below of the invention by giving Examples. Here, the invention is not limited to the Examples below.

EXAMPLES

Example

Preparation of Substrate

Firstly, by oxidizing a monocrystalline silicon substrate, the elastic film 51 which is formed of a silicon dioxide film with a thickness of 170 nm is formed on the surface thereof. Next, the insulating film 52 which is formed of a zirconium oxide film is formed by forming a zirconium film with a thickness of 285 nm on the silicon dioxide film by a sputtering method and thermally oxidizing the result. After that, the adhesive layer 56 which is formed of a titanium oxide film is formed by forming a titanium film with a thickness of 20 nm on the zirconium oxide film by a sputtering method and thermally oxidizing the result. Next, the first electrode 60 with a thickness of 130 nm is formed on the titanium oxide film at 300° C. by a sputtering method to make a substrate with an electrode.

Preparation of Precursor Solution of Seed Layer

An n-octane solution of bismuth 2-ethylhexanoate, iron 2-ethylhexanoate, and titanium 2-ethylhexanoate (all 0.5 mol/L) was mixed such that the mol ratio of Bi:Fe:Ti of each of the elements is 120:60:40 at a mol ratio, a raw material solution (referred to below as a "BFT raw material solution") which included Bi, Fe, and Ti was prepared, and a precursor solution (referred to below as a "BFT precursor solution") of a seed layer was made by dilution with n-octane. Here, the dilution ratio of the n-octane with respect to the BFT raw material solution was 1:7 BFT raw material solution:n-octane. Using the BFT precursor solution, the seed layer 65 which has a composition where the mol ratio (Bi/(Fe+Ti)) of Bi and Fe and Ti was 1.2 and the mol ratio (Fe/Ti) of Fe and Ti was 1.5 was formed in the steps which will be described below.

Preparation of Precursor Solution of Piezoelectric Layer

In order to form the piezoelectric film 72 which is formed of a composite oxide which has a perovskite structure which includes Bi, Ba, Fe, Ti, and Mn, each n-octane solution of bismuth 2-ethylhexanoate, barium 2-ethylhexanoate, iron 2-ethylhexanoate, titanium 2-ethylhexanoate, and manganese 2-ethylhexanoate was mixed such that the mol ratio of Bi:Ba:Fe:Ti:Mn was Bi:Ba:Fe:Ti:Mn=75:25:71.25:25:3.75, and a precursor solution (referred to below as a "BFM-BT precursor solution") of a piezoelectric layer which includes Bi, Ba, Fe, Ti, and Mn was prepared (BFM:BT=75:25).

Forming Seed Layer

The BFT precursor solution is dripped onto the substrate with the electrode described above and a seed layer precursor film is formed by carrying out spin coating by rotating the substrate with the electrode at 3000 rpm (seed layer precursor solution coating step). Next, after heating on a hot plate at 180° C. for 4 minutes, heating was carried out at 350° C. for 4 minutes (seed layer drying step and seed layer degreasing step). Next, using an RTA apparatus, firing was carried out at 700° C. for 5 minutes (seed layer firing step). According to the steps described above, the seed layer 65 was formed with a thickness of 10 nm in an island form which was formed of a composite oxide (also referred to below as "BFT") which has a perovskite structure which includes Bi, Fe, and Ti.

Forming Piezoelectric Layer

Next, the BFM-BT precursor solution was dripped onto the substrate with the electrode, and a piezoelectric layer precursor film was formed by carrying out spin coating by rotating the substrate with the electrode at 3000 rpm (coating step). Next, after heating on a hot plate at 180° C. for 4 minutes, heating was carried out at 350° C. for 4 minutes (drying step and degreasing step). After repeating the steps from the coating step to the degreasing step twice, firing was performed in an oxygen atmosphere at 750° C. for 5 minutes using an RTA apparatus (firing step). By repeating the above steps (a step of carrying out the firing step once after repeating the steps from the coating step to the degreasing step twice) six times, the piezoelectric layer 70 which was formed of a composite oxide (also referred to below as "BFM-BT") which has a perovskite structure which includes Bi, Ba, Fe, Ti, and Mn and which has a thickness of 900 nm as a whole was formed.

Production of Second Electrode and Piezoelectric Element

Next, the second electrode 80 with a thickness of 50 nm was produced on the piezoelectric layer 70 by sputtering platinum by setting the substrate temperature to 600° C. (a high temperature sputtering method). According to the above steps, the piezoelectric element 300 provided with the first electrode 60, the seed layer 65, the piezoelectric layer 70, and the second electrode 80 was produced.

Comparative Example

A piezoelectric element was produced by the same method as the Example apart from forming the platinum film which forms the second electrode at room temperature (25° C.)

Test Example 1

Figure 11A:
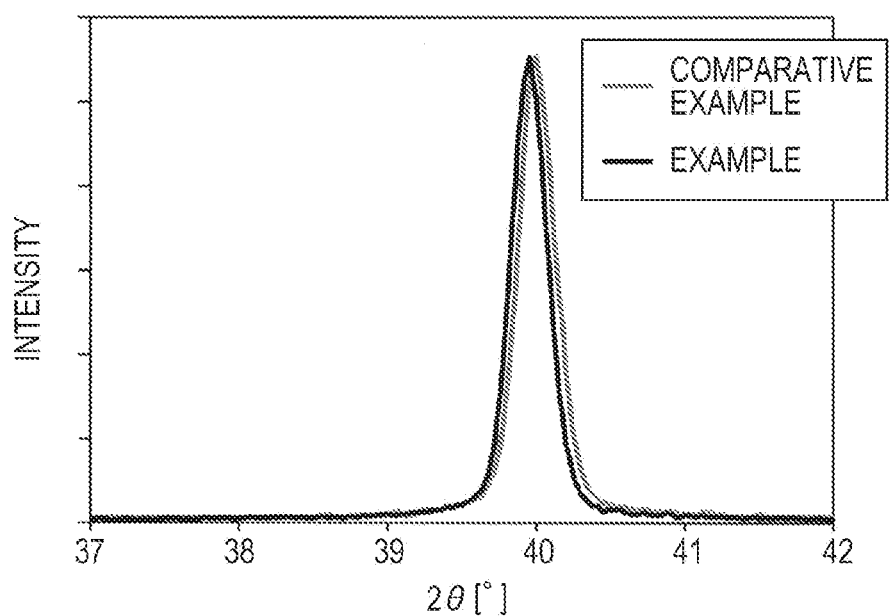
FIGS. 11A and 11B are diagrams which show X-ray diffraction patterns of an Example and a Comparative Example.
Figure 11B:
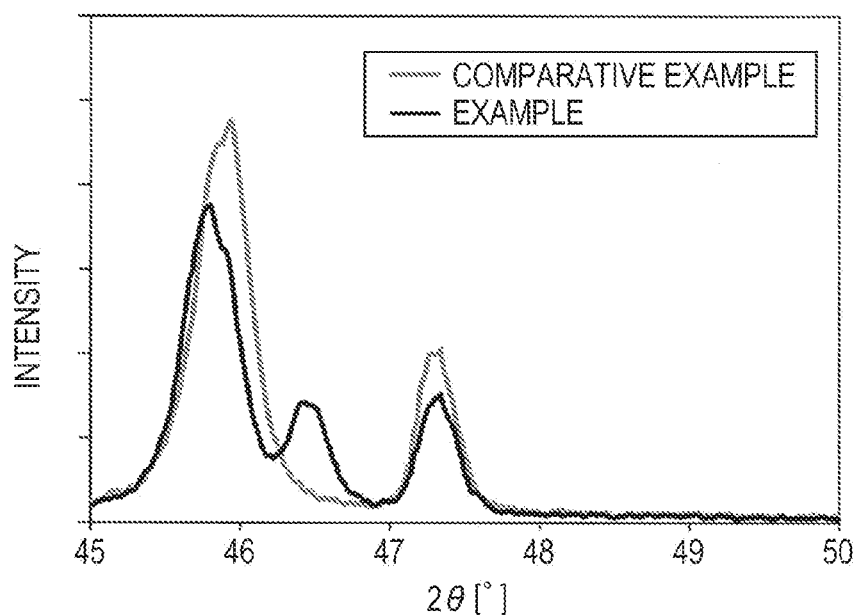
Figure 12:
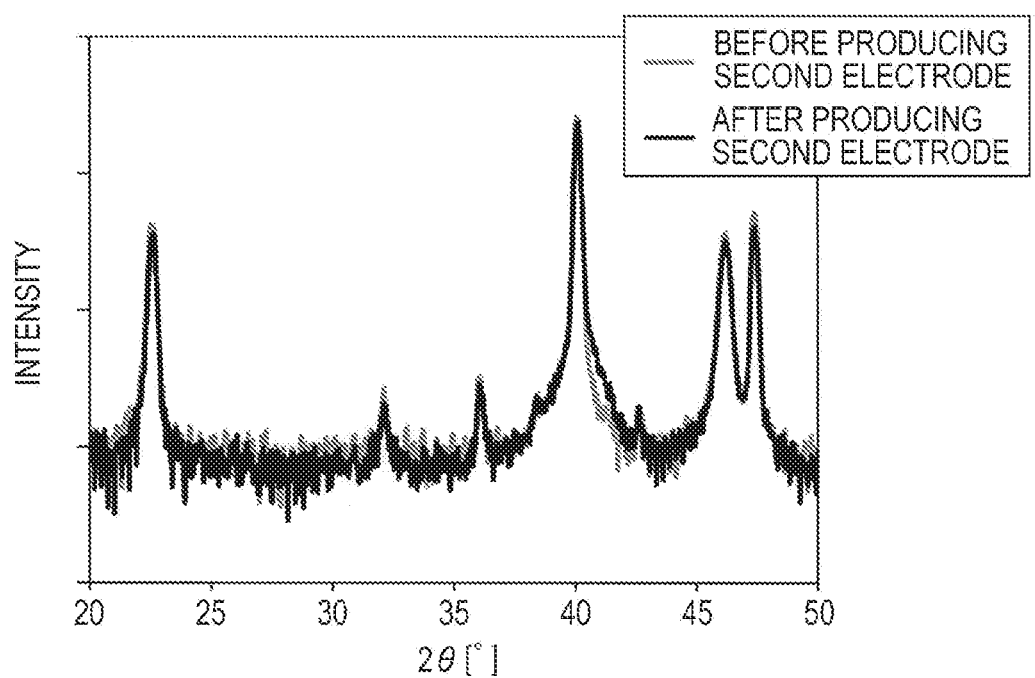
FIG. 12 is a diagram which shows an X-ray diffraction pattern of the Comparative Example.
Figure 13A:
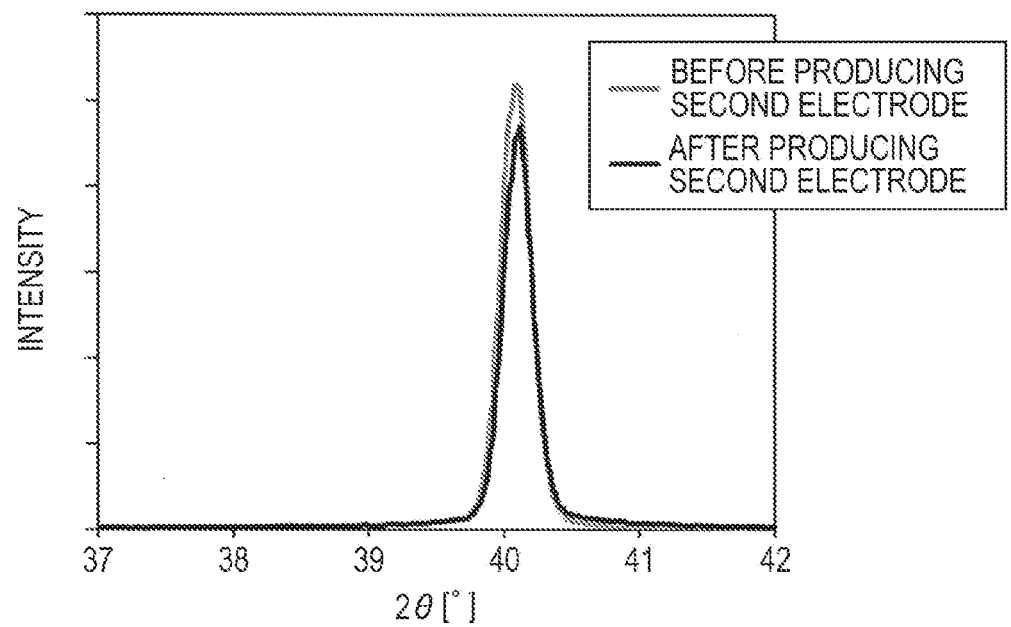
FIGS. 13A and 13B are diagrams which show an X-ray diffraction pattern of the Comparative Example.
Figure 13B:
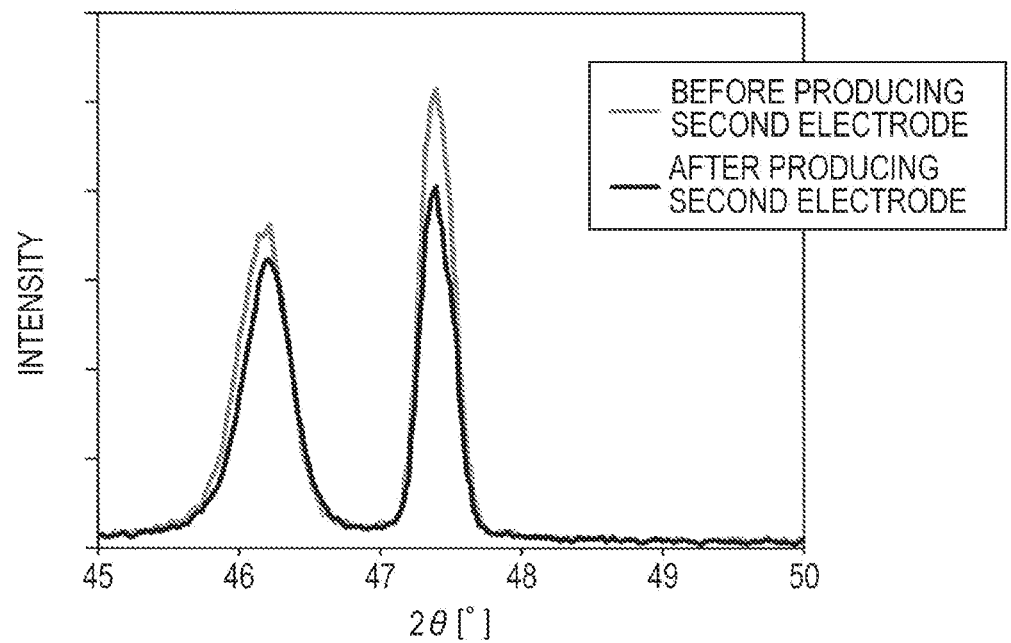

Using "D8 Discover With GADDS; a micro-area X-ray diffraction apparatus" manufactured by Bruker AXS Corp., using a CuKα ray as the X-ray source, X-ray diffraction charts were obtained at room temperature for the Example and Comparative Example. The results are shown in FIG. 10 and FIGS. 11A and 11B. FIG. 11A is a diagram which enlarges the range of 2θ from 37° to 42° in FIG. 10. FIG. 11B is a diagram which enlarges the range of 2θ from 45° to 50° in FIG. 10. In addition, an X-ray diffraction chart before forming the second electrode was obtained and compared to the X-ray diffraction chart for the Comparative Example. The results are shown in FIG. 12 and FIGS. 13A and 13B. FIG. 13A is a diagram which enlarges the range of 2θ from 37° to 42° in FIG. 12. FIG. 13B is a diagram which enlarges the range of 2θ from 45° to 50° in FIG. 12.

In these diagrams, the peak in the vicinity of 2θ=22.5° is a peak which exhibits orientation in the (100) plane. On this measurement principle, the same peak also appears in the vicinity of 2θ=45° which is the position of the (200) plane. These peaks are mainly peaks which are derived from the perovskite which forms the piezoelectric layer 70. In the Example and Comparative Example, it is understood that the piezoelectric layer 70 is oriented in the (100) plane. Here, the peak which appears in the vicinity of 2θ=45° in the description below is referred to as a "peak of perovskite (200)".

In addition, the peak in the vicinity of 2θ=40° is a peak which is derived from platinum which is oriented in the (111) plane. This peak is referred to as the "peak of platinum (111)". In addition, the peak in the vicinity of 2θ=46.5° which is only shown in Example in FIG. 10 and FIG. 11B is a peak which is derived from the (200) plane of platinum. This peak is referred to as the "peak of platinum (200)". The peak of the platinum (200) signifies the presence of platinum which is oriented in the (100) plane; however, recognition of the peak of the (100) plane is not possible due to the limitations on the resolution of the measuring equipment. In a case of comparing the data of the Example and Comparative Example, the peak of the platinum (111) appears in both and the peak of the platinum (200) only appears in Example 1.

Here, the peak in the vicinity of 2θ=47.5° is a peak which is derived from silicon which forms the substrate. Since the position of the peak which is derived from silicon is the same in the Example and the Comparative Example, it is possible to determine that the change in the peak of the perovskite (200) in the Example and the appearance of the peak of the platinum (200) in the Example which will be described below are not due to measurement errors.

These peaks will be analyzed in more detail. Firstly, the change in the peak of the perovskite (200) will be analyzed. From FIG. 12 and FIG. 13B, the peak position of the perovskite (200) before producing the second electrode was 45.92°. From FIG. 10 and FIG. 11B, the peak position of the perovskite (200) after forming the second electrode in Example was 45.80°. From FIG. 10, FIG. 11B, FIG. 12, and FIG. 13B, the peak position of the perovskite (200) in Comparative Example was 46.16° before forming the second electrode and 46.20° after forming the second electrode. While the peak position of the perovskite (200) was not substantially changed before and after forming the second electrode in the Comparative Example, the position of the peak after forming the second electrode in the Example was changed to a lower angle than before the forming. From this, it is understood that the plane intervals of the crystal lattices were enlarged by the second electrode being formed.

In addition, in the Example, while the intensity of the peak of the perovskite (200) was 469 and the half value width was 0.43° before producing the second electrode, the intensity of the peak was 375 and the half value width was 0.46° after producing the second electrode. In this manner, it is understood that lattice variations in the depth direction (the thickness direction) of the piezoelectric layer 70 were large since the peak intensity was decreased and the half value width was widened in the Example and, from this, it is understood that the piezoelectric layer in the vicinity of the second electrode was more greatly affected by the second electrode than the piezoelectric layer in the vicinity of the first electrode. That is, the crystals which form the piezoelectric layer 70 are shrunk in the in-plane direction toward the second electrode side and, moreover, the plane intervals of the crystal lattices are larger toward the second electrode side.

In addition, as described above, in a case of comparing the data of the Example and the Comparative Example in FIG. 10 and FIG. 11B, the peak of the platinum (111) in the vicinity of 2θ=40° appears in both sets of data and the peak of the platinum (200) only appears in Example 1. The only difference between the Example and the Comparative Example is the forming process of the second electrode. From this, it is possible to determine that the first electrode is oriented in the (111) plane and the second electrode is oriented in the (100) plane in Example 1. On the other hand, it is understood that the first electrode is oriented in the (111) plane and the second electrode is not preferentially oriented at least in the (100) plane in Comparative Example. It is possible to consider that the second electrode is not crystallized or is randomly oriented in the Comparative Example. In a case where the second electrode is randomly oriented, the peak on the (111) plane which is caused by random orientation overlaps the peak on the (111) plane of the first electrode and the peak on the (200) plane which is caused by random orientation is hidden by the hem of the peak on the (200) plane of the piezoelectric layer.

Other Embodiment

Description was given above of an embodiment of the invention; however, the invention is not limited to the description above. For example, the piezoelectric layer 70 was made by a liquid phase method in the embodiment and Example described above; however, it is also possible to form the piezoelectric layer 70 by a gas phase method such as a laser ablation method, a sputtering method, a pulse laser deposition method (a PLD method), a CVD method, or an aerosol deposition method. Even in a case where the piezoelectric layer 70 is formed by a gas phase method, it is possible to apply the invention in a case where tensile stress is generated in the in-plane direction of the piezoelectric layer 70.

Here, in the embodiment described above, description was given with the ink jet recording head I as an example of a liquid ejecting head; however, the invention targets a wide range of liquid ejecting heads and, naturally, it is possible to apply the invention to a liquid ejecting head which ejects liquid other than ink. Examples of other liquid ejecting heads include various types of recording heads which are used for image recording apparatuses such as printers, coloring material ejecting heads which are used for manufacturing color filters such as liquid crystal displays, electrode material ejecting heads which are used for forming electrodes of organic EL displays, field emission displays (FED), or the like, bio-matter ejecting heads which are used for manufacturing bio chips, and the like.

In addition, it is also possible to use the piezoelectric element according to the invention for other devices without being limited to the piezoelectric element which is used for liquid ejecting heads. Examples of other devices include ultrasonic devices such as ultrasonic transmitters, ultrasonic motors, temperature-electricity convertors, pressure-electricity converters, ferroelectric transistors, piezoelectric transformers, filters such as shielding filters for harmful rays such as infrared rays, optical filters which use photonic crystal effects by forming quantum dots, optical filters which use the light interference of a thin film, and the like. In addition, it is also possible to apply the invention to a piezoelectric element which is used as a sensor and a piezoelectric element which is used as a ferroelectric memory. Examples of sensors in which the piezoelectric element may be used include infrared ray sensors, supersonic sensors, thermosensitive sensors, pressure sensors, piezoelectric sensors, gyro sensors (angle speed sensors), and the like.

The entire disclosure of Japanese Patent Application No. 2015-157626, filed Aug. 7, 2015 is expressly incorporated by reference herein.

What is claimed is:

1. A piezoelectric element comprising:
a first electrode;
a piezoelectric layer which is provided on the first electrode and which is formed of crystals of a composite oxide with a perovskite structure which is preferentially oriented in a (100) plane; and
a second electrode which is provided on the piezoelectric layer and which is formed of platinum which is preferentially oriented in a (100) plane,
wherein, in the piezoelectric layer, plane intervals of the crystals on the second electrode side are larger than plane intervals of the crystals on the first electrode side.

2. The piezoelectric element according to claim 1,
wherein, in the piezoelectric layer, an A-site includes bismuth and a B-site includes iron and titanium.

3. A piezoelectric element application device comprising: the piezoelectric element according to claim 1.

4. A piezoelectric element application device comprising: the piezoelectric element according to claim 2.

* * * * *